(12) United States Patent
Au et al.

(10) Patent No.: US 8,853,840 B2
(45) Date of Patent: Oct. 7, 2014

(54) SEMICONDUCTOR PACKAGE WITH INNER AND OUTER LEADS

(71) Applicants: Yin Kheng Au, Petaling Jaya (MY); Pey Fang Hiew, Kajang (MY); Jia Lin Yap, Klang (MY)

(72) Inventors: Yin Kheng Au, Petaling Jaya (MY); Pey Fang Hiew, Kajang (MY); Jia Lin Yap, Klang (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/773,594

(22) Filed: Feb. 21, 2013

(65) Prior Publication Data

US 2014/0231978 A1 Aug. 21, 2014

(51) Int. Cl.
  *H01L 23/49* (2006.01)
  *H01L 23/495* (2006.01)
  *H01L 21/56* (2006.01)

(52) U.S. Cl.
  CPC ............ *H01L 23/495* (2013.01); *H01L 21/565* (2013.01); *H01L 23/49555* (2013.01)
  USPC ............ 257/676; 257/E23.032; 257/E23.038; 438/123; 438/124

(58) Field of Classification Search
  CPC .................... H01L 23/49555; H01L 23/49586
  USPC .................. 257/666, 676, E23.032, E23.034, 257/E23.038; 438/123, 124
  See application file for complete search history.

(56) References Cited

U.S. PATENT DOCUMENTS

| | | | |
|---|---|---|---|
| 6,104,084 A * | 8/2000 | Ishio et al. ..................... 257/666 |
| 7,193,298 B2 | 3/2007 | Hong | |
| 7,968,998 B1 | 6/2011 | Choi | |
| 7,977,774 B2 | 7/2011 | Choi | |
| 8,188,579 B1 | 5/2012 | Kim | |
| 2001/0009301 A1* | 7/2001 | Azuma ......................... 257/698 |
| 2009/0079074 A1* | 3/2009 | Motonaga ..................... 257/738 |
| 2010/0290202 A1 | 11/2010 | Sasaki | |
| 2011/0133316 A1* | 6/2011 | Huang et al. .................. 257/659 |
| 2012/0153444 A1* | 6/2012 | Haga et al. ..................... 257/666 |
| 2014/0080264 A1* | 3/2014 | Chan et al. ..................... 438/123 |
| 2014/0097530 A1* | 4/2014 | Boo ............................... 257/676 |
| 2014/0103515 A1* | 4/2014 | Kanemoto ..................... 257/676 |

* cited by examiner

*Primary Examiner* — Allan R Wilson
(74) *Attorney, Agent, or Firm* — Charles Bergere

(57) ABSTRACT

A semiconductor die has outer leads with an outer lead external connection section and an outer lead bonding section. Inner leads are spaced from the outer leads. Each of the inner leads has an inner lead external connection section spaced and downset from an inner lead bonding section. A non-electrically conductive die mount is molded onto upper surface areas of each inner lead external connection section. A semiconductor die is mounted on the non-electrically conductive die mount and bond wire provide interconnects for selectively electrically connecting bonding pads of the die to the inner lead bonding sections and at least one outer lead bonding section. A mold compound covers the semiconductor die, the bond wires, and the outer and inner lead bonding sections.

11 Claims, 13 Drawing Sheets

700

SEMICONDUCTOR PACKAGE WITH INNER AND OUTER LEADS

BACKGROUND OF THE INVENTION

The present invention relates to semiconductor die packaging and, more particularly, to a semiconductor package and a lead frame for a semiconductor package.

When a semiconductor die is packaged with a lead-frame, the semiconductor die is mounted to a die attach pad, often called a flag. Tie bars attach the flag to an outer frame of the lead frame. The lead frame has lead fingers extending from the outer frame towards the flag. The lead fingers have external connector pads, that are wire bonded to pads or electrodes of the die, and provide a means of easily electrically connecting the die to circuit boards and the like. After the electrodes and external connector pads are electrically connected, the semiconductor die and a part of the lead fingers are encapsulated in a molding compound such as a plastics material to form a packaged device, leaving only the outer frame and undersides of the external connector pads exposed. The semiconductor die package is then cut (singulated) from the outer frame.

Semiconductor die packages are often assembled with an increased functionality and thus the number of external connectors (pin count) must often be increased to accommodate the increased functionality and power supply rail requirements of the semiconductor die. The number of external connectors is due to the increase in the number of die connection pads comprising power rail pads, ground rail pads and data input and output pads. However, the number of lead fingers is limited by the size of the package and lead finger pitch.

Lengths of the lead fingers may extend outside the mold compound, or in the case of surface mounted semiconductor packages, a surface of the lead fingers is exposed at the bottom of the package for electrical connection to a circuit board. An example of a surface mounted package is the Quad Flat Non-leaded (QFN) package, which includes exposed contact pads or terminals beneath and on four sides of a rectangular semiconductor package. It would therefore be advantageous if semiconductor packages could have both lead fingers extending outside peripheral edges of the packaging compound (package housing) and lead fingers allowing for surface mounting whilst maintaining a relatively small footprint.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
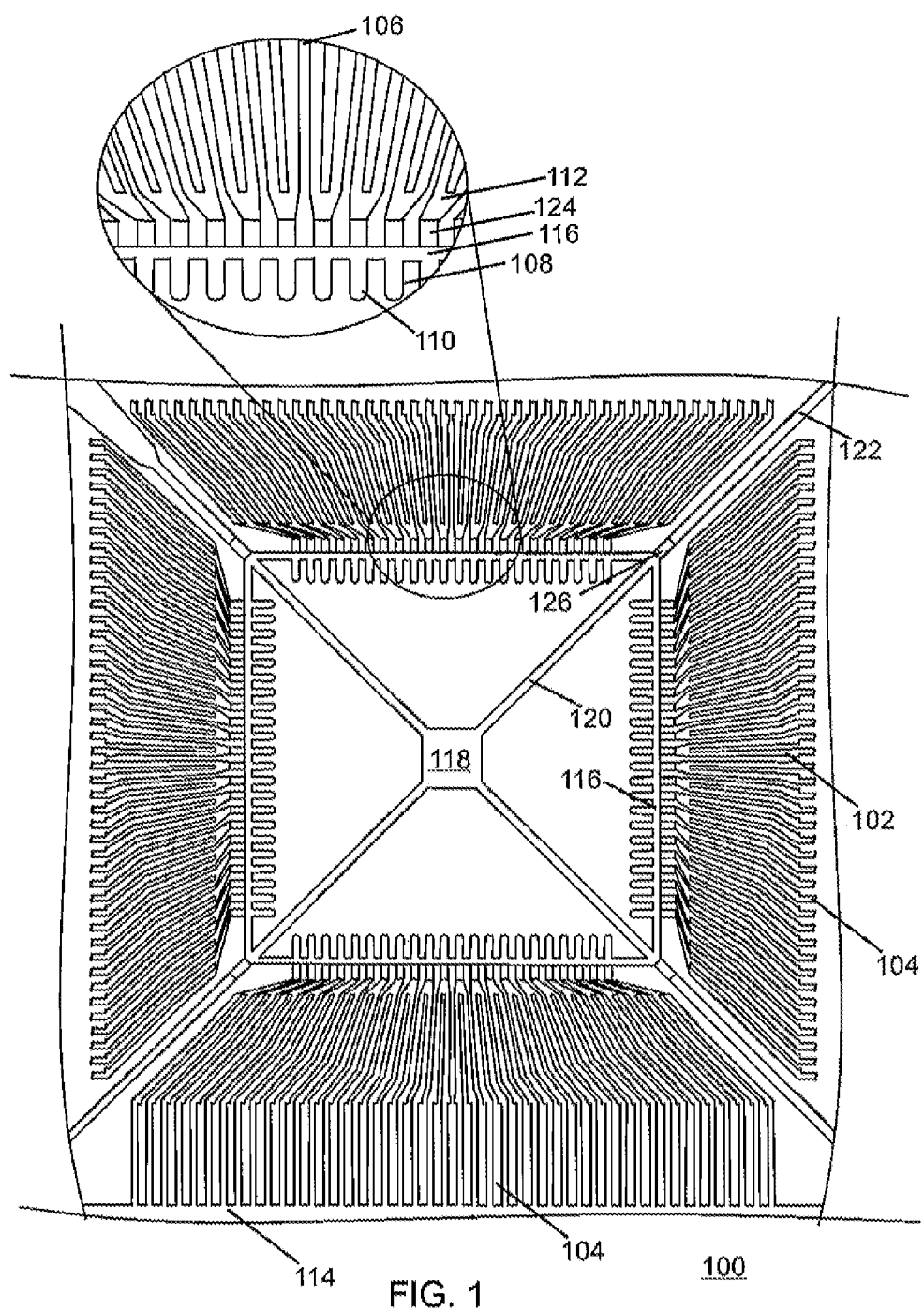
FIG. 1 is a top plan view of a part of a lead frame in accordance with a first preferred embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a semiconductor die package including a plurality of outer leads each having an outer lead external connection section and an outer lead bonding section. There is a plurality of inner leads spaced from the outer leads, each of the inner leads having an inner lead external connection section spaced and downset from an inner lead bonding section. The package has a non-electrically conductive die mount molded onto upper surface areas of each inner lead external connection section. A semiconductor die is mounted on the non-electrically conductive die mount. Bond wires provide interconnects for selectively electrically connecting bonding pads of the die to at least one inner lead bonding section and at least one outer lead bonding section. A mold compound provides at least part of a housing for the semiconductor die, the bond wires, and each outer and inner lead bonding section.

In another embodiment the present invention provides a method for assembling a semiconductor die package. The method includes providing a lead frame assembly with a plurality of outer leads each having an outer lead external connection section and an outer lead bonding section. There is also a plurality of inner leads having an inner lead external connection section downset from an inner lead bonding section. There is a non-electrically conductive die mount molded onto upper surface areas of each inner lead external connection section. The method includes mounting a semiconductor die on the non-electrically conductive die mount and then selectively electrically connecting bonding pads of the semiconductor die to the inner or outer lead bonding sections. Thereafter an encapsulation process is performed in which the semiconductor die, bond wire, and each outer and inner lead bonding section are at least partially covered with a molding compound to thereby form the semiconductor die package.

Referring now FIG. 1, part of a lead frame 100 in accordance with a first preferred embodiment of the present invention is shown. The lead frame 100 includes a plurality of outer leads 102 each having an outer lead external connection section 104 and an outer lead bonding section 106. The lead frame 100 also has a plurality of inner leads 108 having an inner lead external connection section 110 downset from an inner lead bonding section 112.

The lead frame 100 has a peripheral enclosing frame 114, an inner frame 116 and a centrally disposed flag 118 supported by support struts that have an inner strut section 120 extending from the flag 118 to the inner frame 116 and an outer strut section 122 extending from the inner frame 116 to the peripheral enclosing frame 114.

The outer leads 102, starting at the outer lead external connection section 104, extend inwardly from a peripheral enclosing frame 114 to the inner lead bonding section 112. More specifically, in this embodiment, pairs of adjacent outer leads 102 are integrally formed with a respective inner lead 108. The inner leads 108 extend either side of the inner frame 116 such that the inner lead external connection section 110 extends inwardly from the inner frame 116 towards a central area of the lead frame 100.

An angled section 124 of the inner leads 108 is disposed between the inner lead bonding section 112 and inner lead external connection section 110. There is also an angled section 126 in outer strut section 122 and therefore the angled sections 124, 126 together provide the downset for the inner lead external connection section 110.

Figure 2:
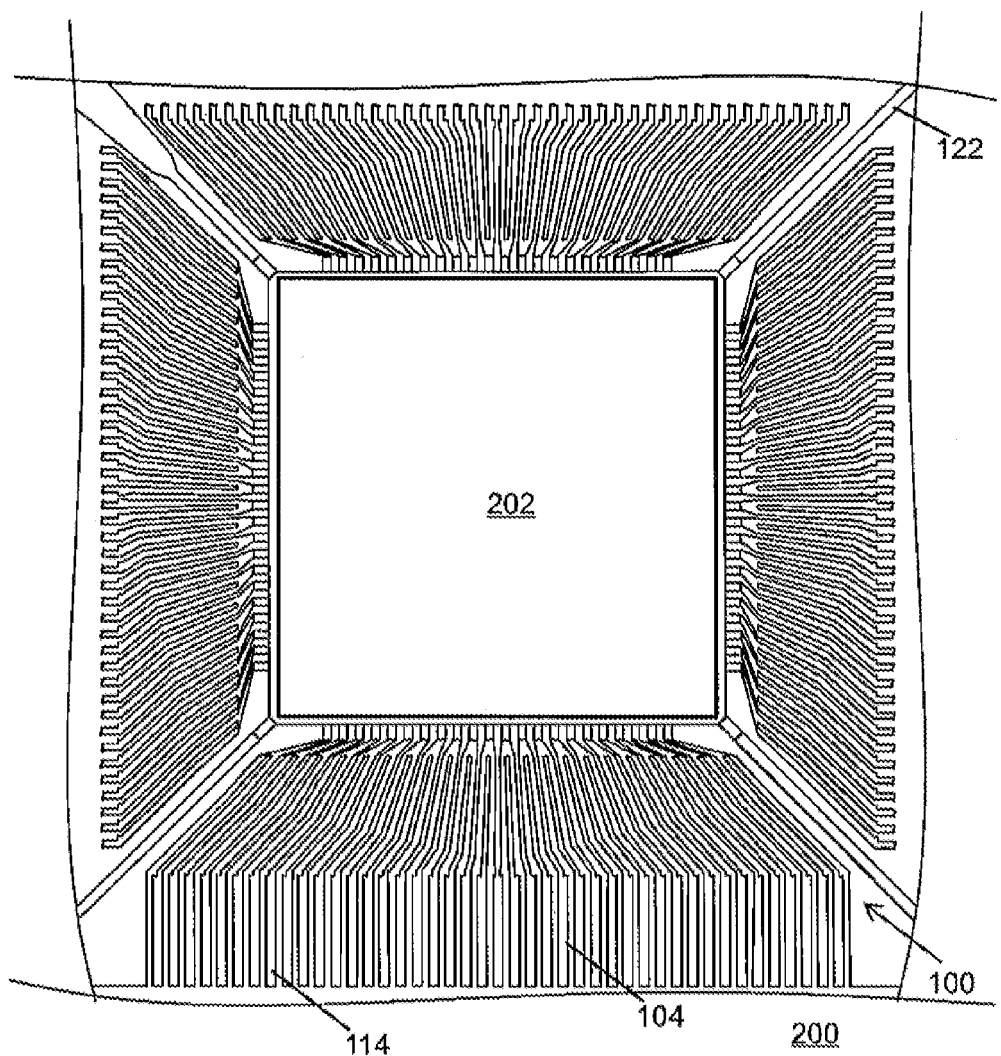
FIG. 2 is a top plan view of a lead frame assembly, including the lead frame of FIG. 1 with a molded non-electrically conductive die mount, in accordance with the first preferred embodiment of the present invention.

FIG. 2 illustrates a top plan view of a lead frame assembly 200, including the lead frame of 100 with a molded non-electrically conductive die mount 202, in accordance with the first preferred embodiment of the present invention. The molded non-electrically conductive die mount 202, typically an injection molded plastics material, is molded onto upper surface areas of each inner lead external connection section 110 and has a boundary defined by the inner frame 116. Furthermore, in this embodiment the die mount 202 is molded to both the flag 118 and inner strut sections 120.

Figure 3:
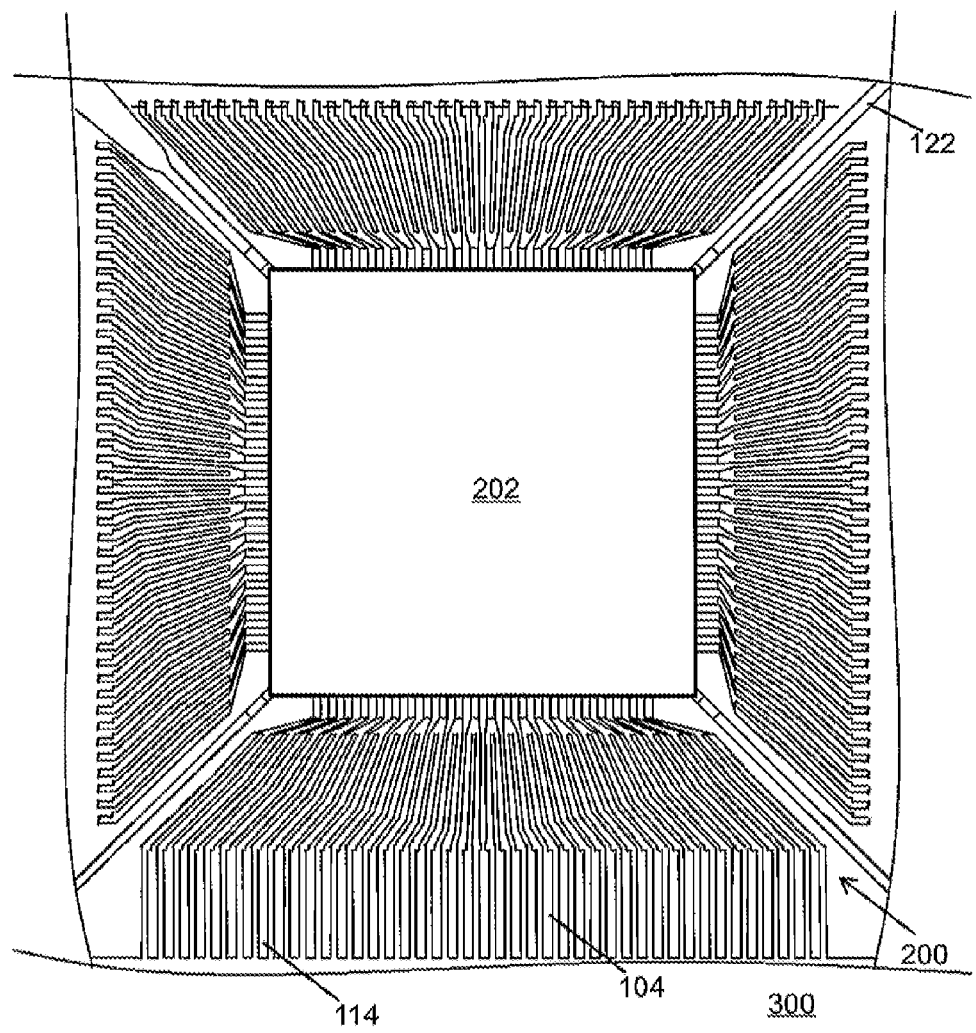
FIG. 3 is a top plan view of a modified lead frame assembly that is a processed version of the lead frame assembly of FIG. 2 after removal of an inner frame, in accordance with the first preferred embodiment of the present invention.

FIG. 3 shows a top plan view of a modified lead frame assembly 300 that is a processed version of the lead frame assembly of 200 after removal of the inner frame 116, in accordance with the first preferred embodiment of the present invention. The inner frame 116 is removed from the lead frame 100 by a punching process that is known in the art. After removal of the inner frame 116 the inner leads 108 are supported by the non-electrically conductive die mount 202 and outer leads 102.

Figure 4:
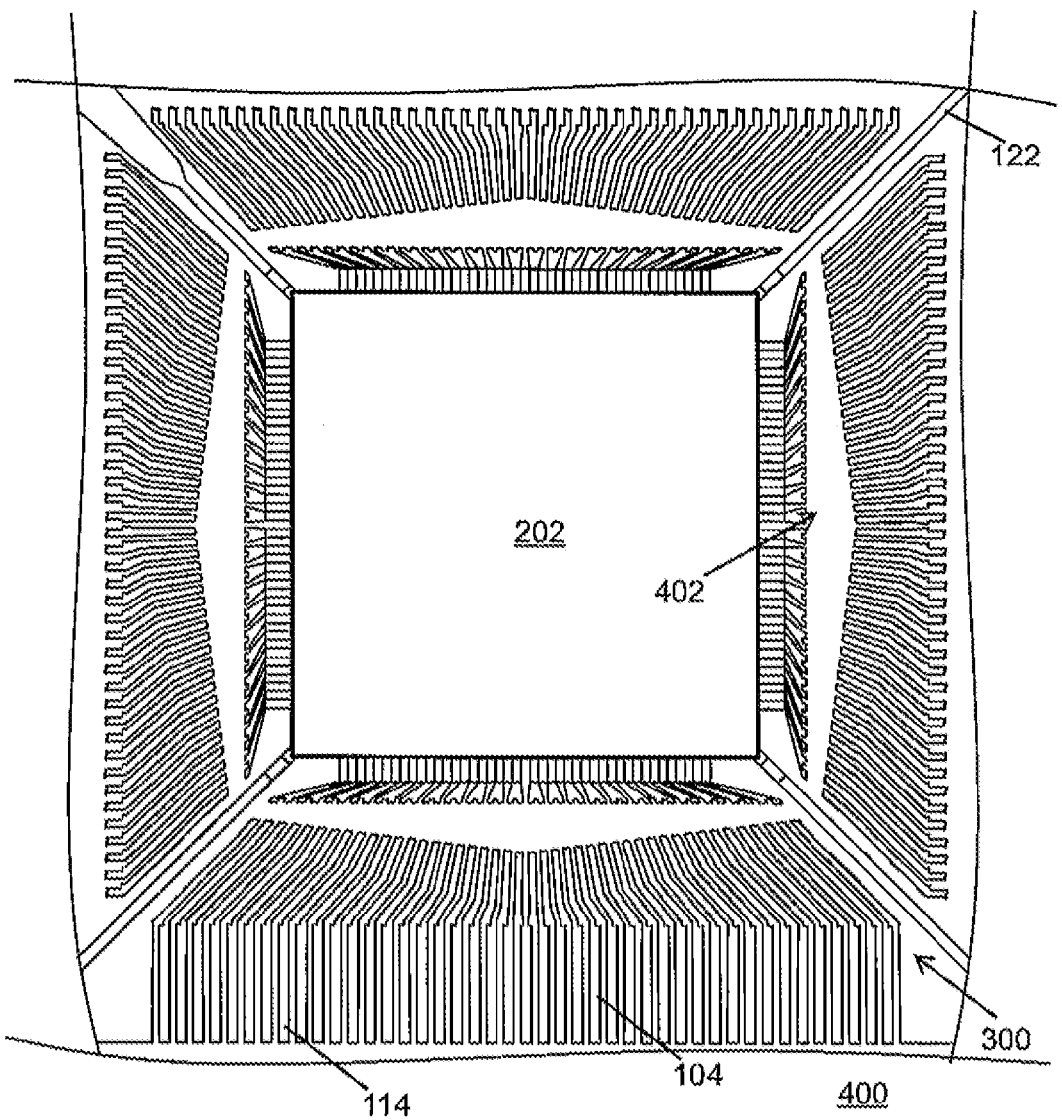
FIG. 4 is a top plan view of a further modified lead frame assembly that is a processed version of the modified assembly of FIG. 3 after separating and spacing inner leads from outer leads, in accordance with the first preferred embodiment of the present invention.

FIG. 4 shows a top plan view of a further modified lead frame assembly 400 that is a processed version of the modified assembly of 300 after separating and spacing the inner leads 108 from the outer leads 102, in accordance with the first preferred embodiment of the present invention. The separating and spacing is performed by a punching process that is known in the art which removes sacrificial lengths of the outer leads 102 to leave a space 402 between the leads 102, 108. After the inner leads 108 are separated from the outer leads 102, the inner leads are only supported by the non-electrically conductive die mount 202 and the outer leads 102 are only supported by the peripheral enclosing frame 114.

Figure 5:
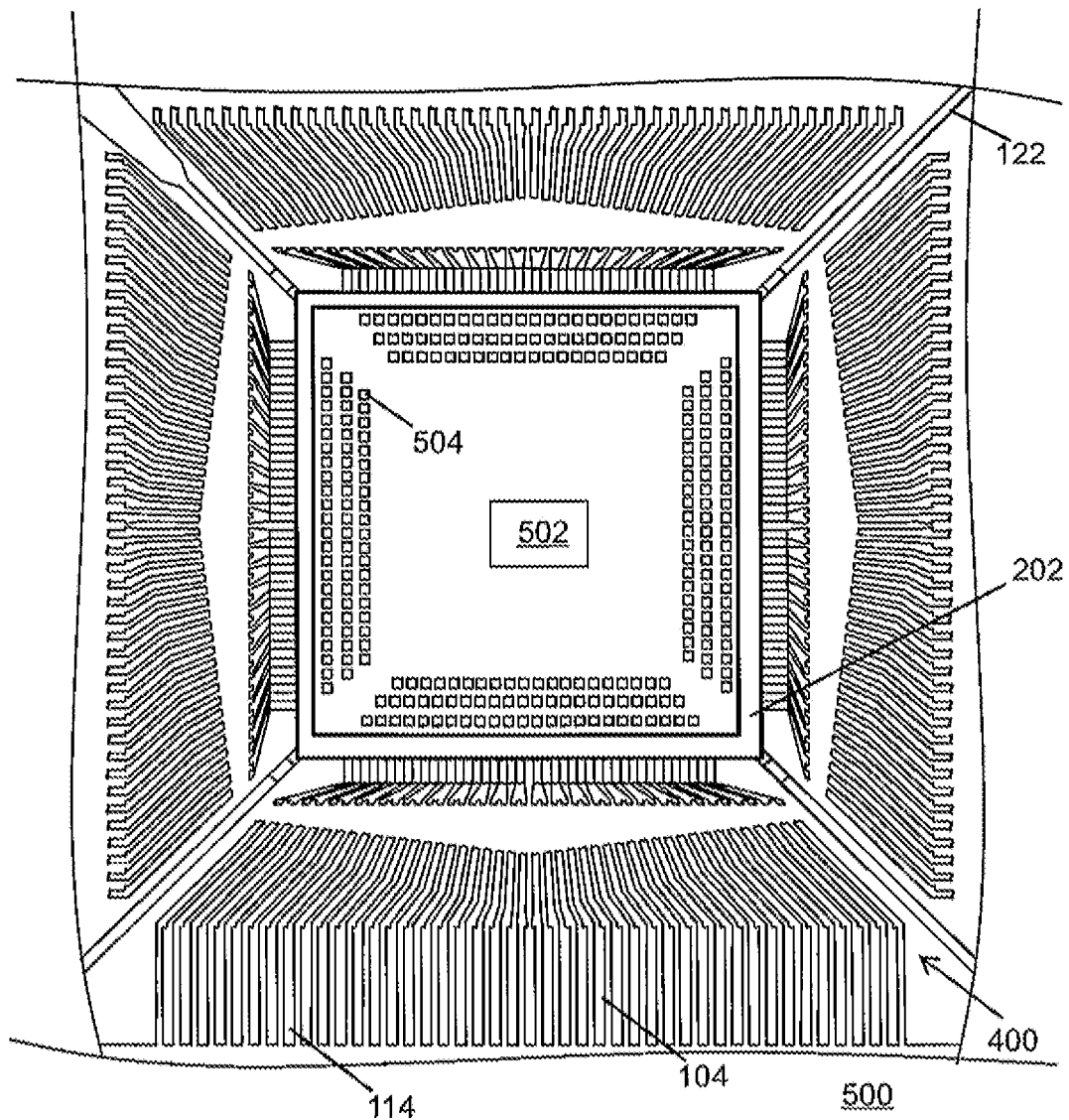
FIG. 5 is a top plan view of a partly assembled semiconductor die package including the further modified assembly of FIG. 4 with a semiconductor die mounted on the non-electrically conductive die mount, in accordance with the first preferred embodiment of the present invention.

Referring to FIG. 5, a top plan view of a partly assembled semiconductor die package 500 including further modified assembly of 400 with a semiconductor die 502 mounted on the non-electrically conductive die mount 202, in accordance with the first preferred embodiment of the present invention, is shown. The semiconductor die 502 has bonding pads 504 that provide access to circuitry with the die 502 and the die 502 is fixed in position on the die mount 202 by an adhesive that is typically an epoxy resin.

Figure 6:
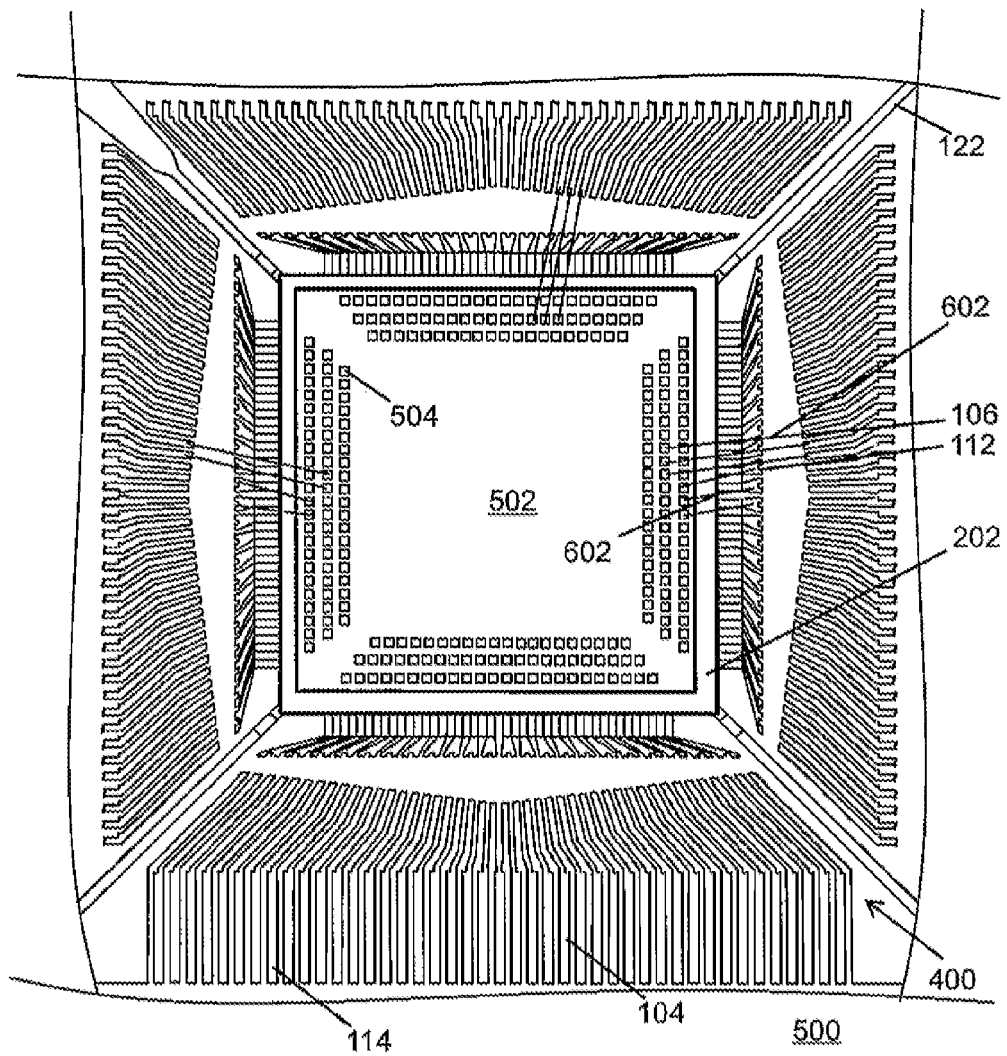
FIG. 6 is a top plan view of the partly assembled semiconductor die package of FIG. 5 after wire bonding, in accordance with the first preferred embodiment of the present invention.

Referring to FIG. 6 there is illustrated a top plan view of the partly assembled semiconductor die package 500 after wire bonding, in accordance with the first preferred embodiment of the present invention. As shown, the partly assembled semiconductor die package 500 has bond wires 602 selectively electrically connecting the bonding pads 504 of the die 502 to the inner lead bonding section 112 or the outer lead bonding section 108.

Figure 7:
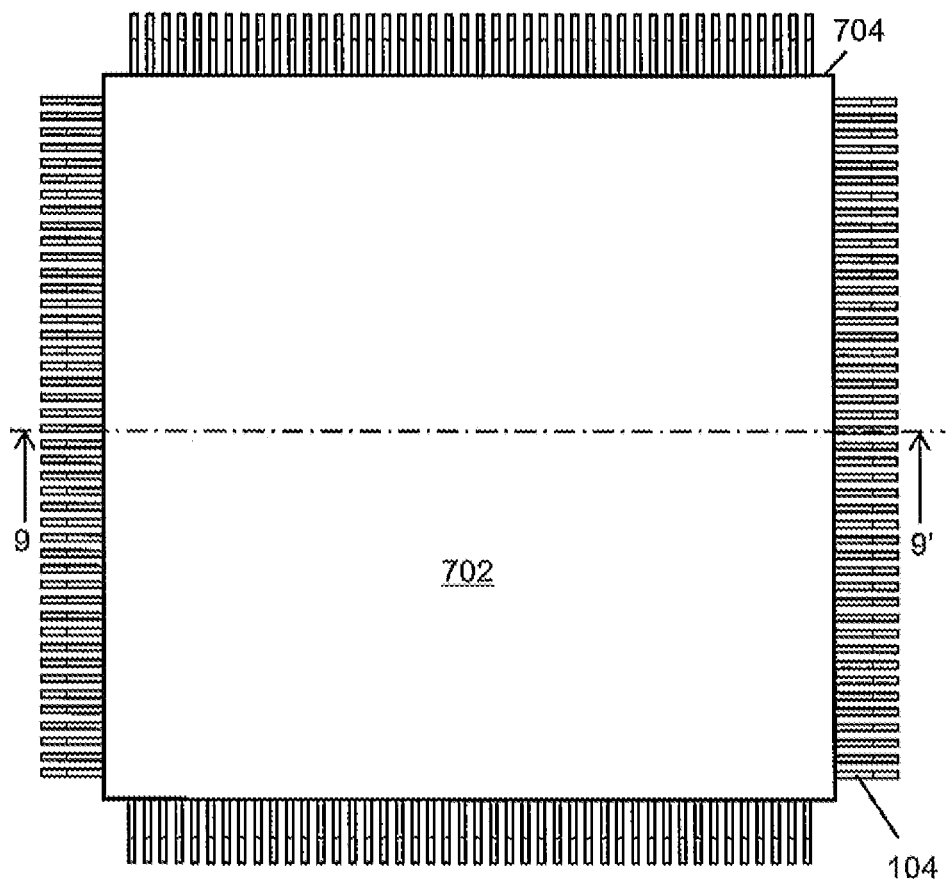
FIG. 7 is a top plan view of a semiconductor die package, in accordance with the first preferred embodiment of the present invention.

FIG. 7 shows a top plan view of a semiconductor die package 700, in accordance with the first preferred embodiment of the present invention. The semiconductor die package 700 has a mold compound 702 providing at least part of a housing 704 for the semiconductor die 502, the bond wires 602, and each outer and inner lead bonding section 106,112. The peripheral enclosing frame 114 has been removed from the package 700 by punching (often referred to as singulation) and the outer lead external connection section 104 has been trimmed and formed by punching and a bending process.

Figure 8:
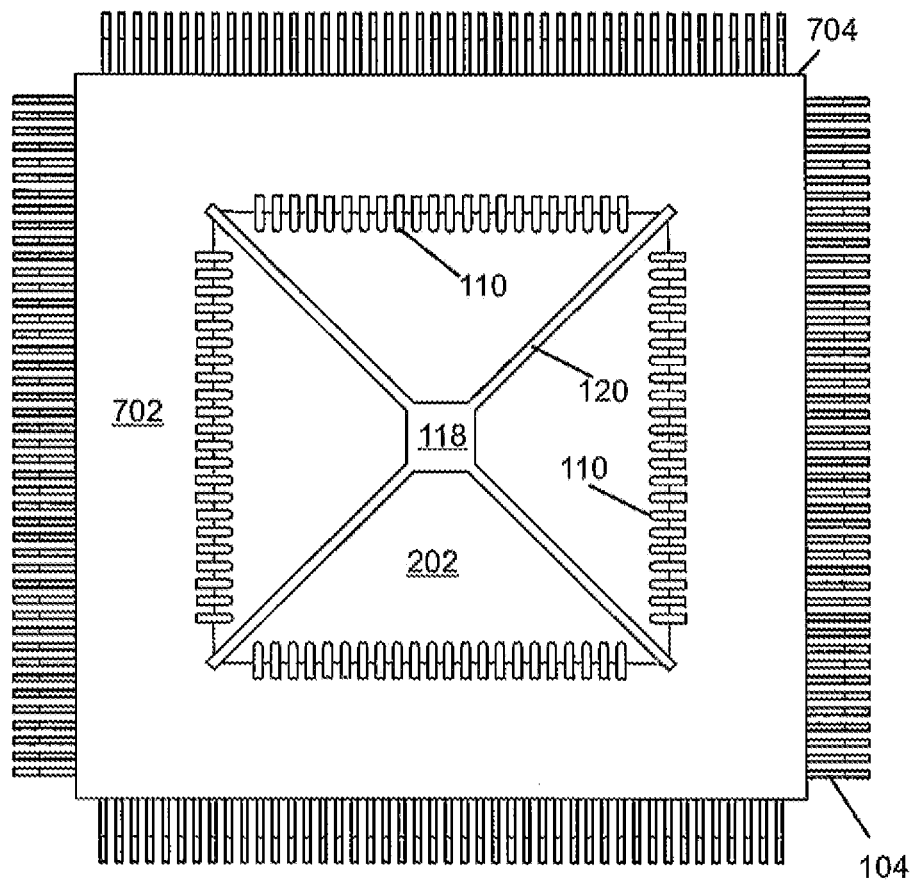
FIG. 8 is an underside plan view of the semiconductor die package of FIG. 7, in accordance with the first preferred embodiment of the present invention.

Referring to FIG. 8 there is illustrated an underside plan view of the semiconductor die package 700, in accordance with the first preferred embodiment of the present invention. As shown in this embodiment, die mount 202 surrounds but does not fully enclose the inner lead connection sections 110, flag 118 and inner strut sections 120.

Figure 9:
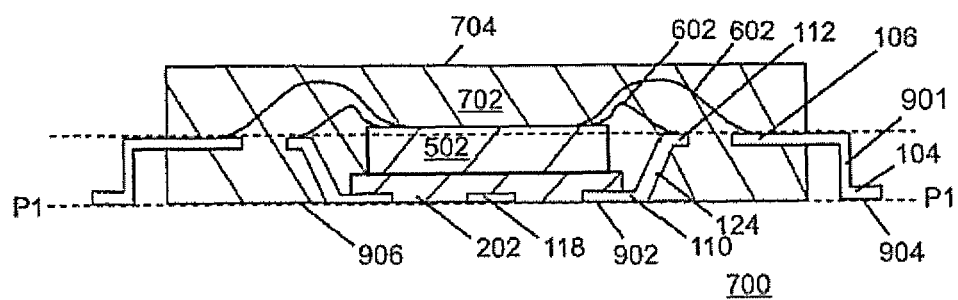
FIG. 9 is a cross sectional side view of the semiconductor die package of FIG. 7 through 9-9', in accordance with the first preferred embodiment of the present invention.

Referring to FIG. 9 there is illustrated a cross sectional side view of the semiconductor die package 700 through 9-9', in accordance with the first preferred embodiment of the present invention. As illustrated, the outer lead external connection section 104 is downset from the outer lead bonding section 106. In this regard, each of the outer leads 102 has an angled section 901 that provides each outer lead downset. This angled section 901 is substantially upright and is between the outer lead external connection section 110 and the inner lead bonding section 112, and in this embodiment the angled section 901 is external to the housing 704.

As shown, the inner lead external connection section 110 has a planar inner lead external mounting surface 902 and the outer lead external connection section 104 has a planar outer lead external mounting surface 904 that is co-planar with the planar inner lead external mounting surface 902. Thus, the inner lead external mounting surface 902 and outer lead external mounting surface 904 lie in a mounting plane P1. Furthermore, the outer lead bonding section 106 and inner lead bonding section 112 have coplanar surfaces and the non-electrically conductive die mount 202 has a continuous surface for supporting the semiconductor die 502.

The housing 704 is formed from both the mold compound 702 and non-electrically conductive die mount 202 in which both the mold compound 702 and non-electrically conductive die mount 202 forms an underside 906 of the housing 704. As illustrated, the inner lead external mounting surface 902 is coplanar with the underside 906 of the housing 704. However, by suitable selection of the thermal shrinkage characteristics of the molding compounds used and moulding die configuration, the inner lead external mounting surface 902 may protrude from the underside 906 of the housing 700.

Figure 10:
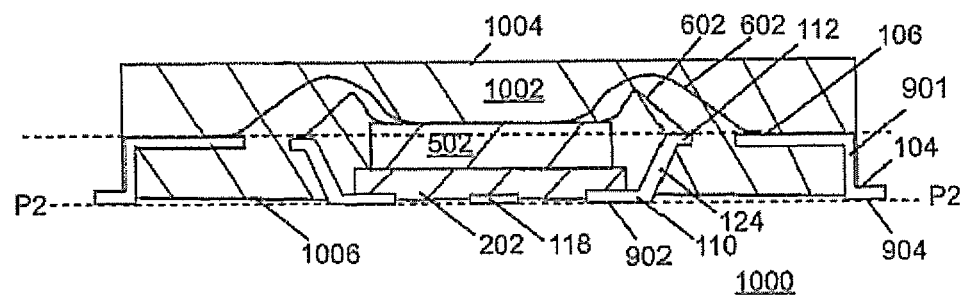
FIG. 10 is a cross sectional side view of another semiconductor die package in accordance with a second preferred embodiment of the present invention.

Referring to FIG. 10, a cross-sectional, side view of another semiconductor die package 1000 in accordance with a second preferred embodiment of the present invention. The semiconductor die package 1000 is similar to the semiconductor die package 700 and therefore to avoid repetition only the differences will be described. In this embodiment, a mold compound 1002 provides at least part of a slightly larger housing 1004 and the angled section is therefore covered by the housing 1004. Also, the inner lead external mounting surface 902 protrudes from an underside 1006 of the housing 1004. However, in other embodiments the inner lead external mounting surface 902 may be coplanar with the underside 1006 of the housing 1004.

Figure 11:
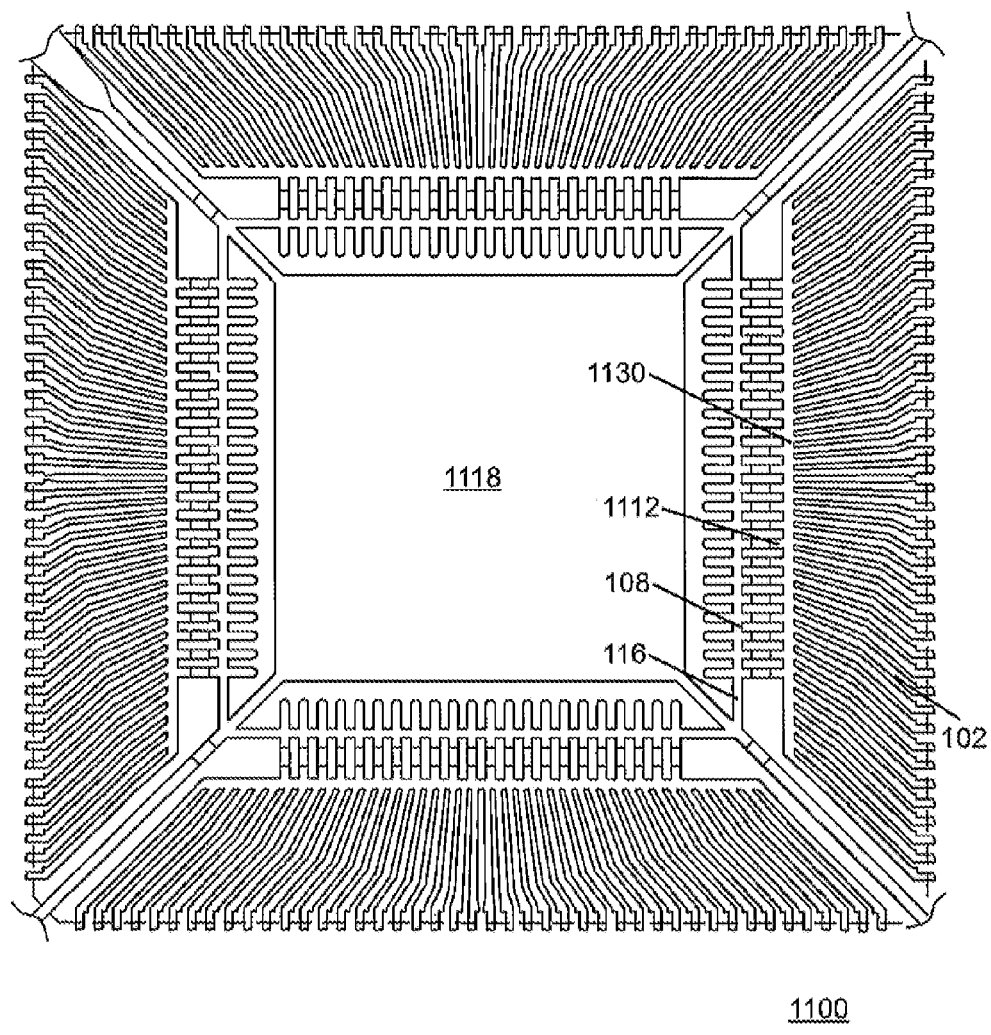
FIG. 11 is a top plan view of a part of a lead frame in accordance with a third preferred embodiment of the present invention.

FIG. 11 shows a top plan view of a part of a lead frame 1100 in accordance with a third preferred embodiment of the present invention. The lead frame 1100 is similar to the lead frame 100 and therefore to avoid repetition only the differences will be described. As shown, the lead frame 1100 has an enlarged flag 1118 and each inner lead bonding section 1112 is joined together at a common sacrificial lead frame region 1130. Similarly, all the outer leads 102 are joined together at the common sacrificial lead frame region 1130 and the inner leads 108 extend either side of the inner frame 116.

Figure 12:
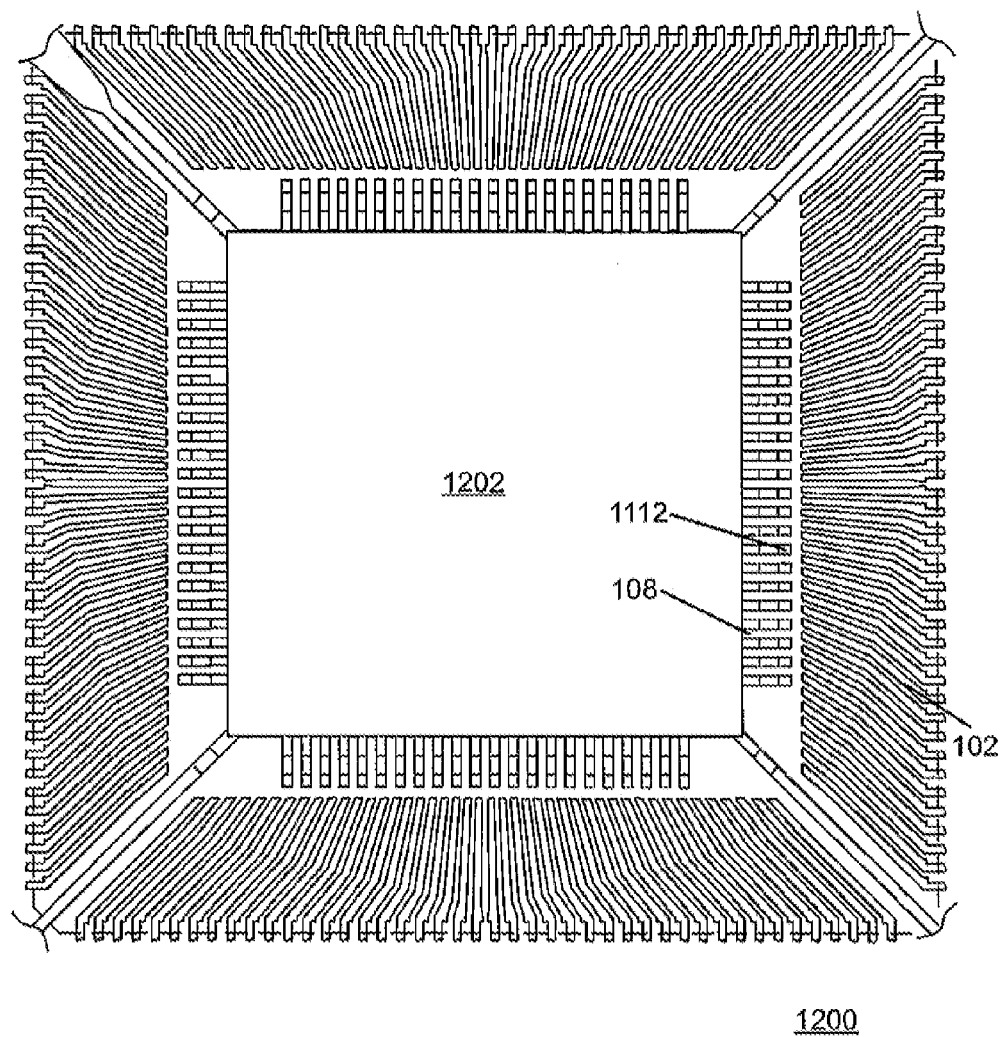
FIG. 12 is a top plan view of a lead frame assembly including the lead frame of FIG. 11 with a non-electrically conductive die mount, an inner fame removed, and inner leads separated and spaced from outer leads, in accordance with the third preferred embodiment of the present invention.

Referring to FIG. 12, a top plan view of a lead frame assembly 1200 including the lead frame 1100 with a non-electrically conductive die mount 1202, the inner fame 116 removed, and the inner leads 108 separated and spaced from the outer leads 102, in accordance with the third preferred embodiment of the present invention, is shown. In this regard the separation and spacing is provided, in part, by the removal of the common sacrificial lead frame region 1130. The lead frame assembly 1200 can then be further processed to provide a semiconductor die package 700 or 1000 as will be apparent to a person skilled in the art.

Figure 13:
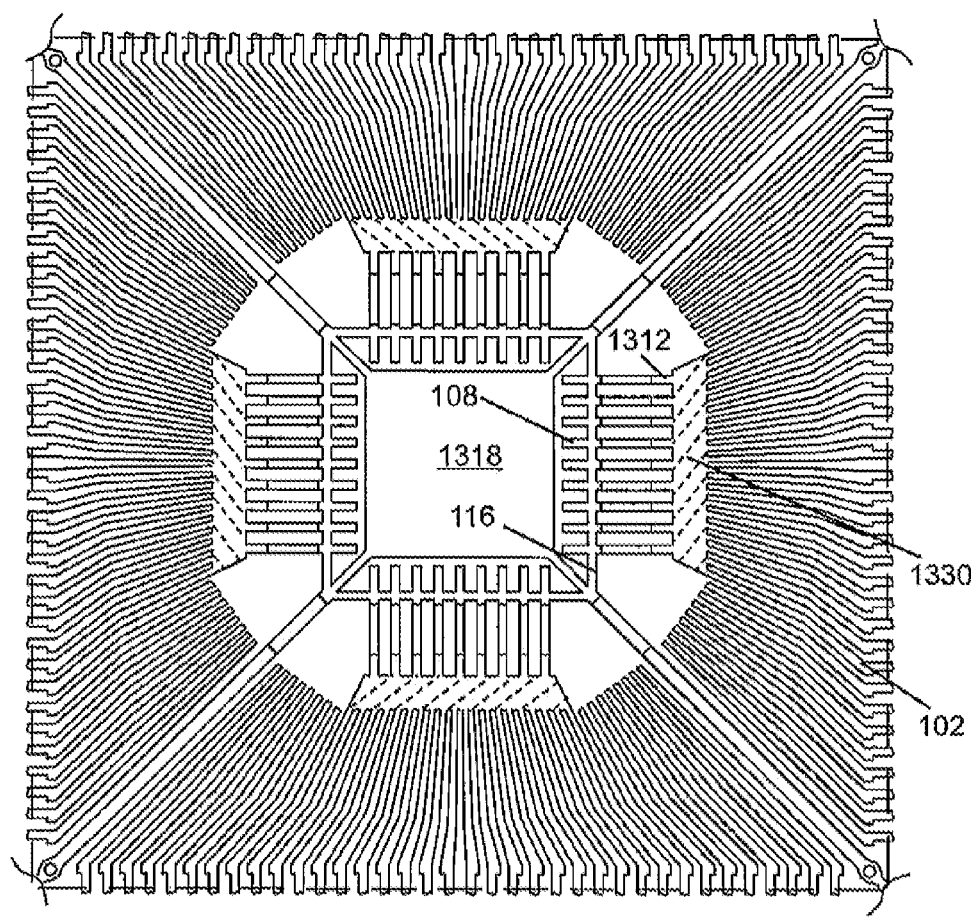
FIG. 13 is a top plan view of a part of a lead frame in accordance with a fourth preferred embodiment of the present invention.

Referring to FIG. 13, a top plan view of a part of a lead frame 1300 in accordance with a fourth preferred embodiment of the present invention is shown. The lead frame 1300 is similar to the lead frame 100 and therefore to avoid repetition only the differences will be described. As shown, the lead frame 1300 has an enlarged flag 1318 and each inner lead bonding section 1312 is joined together at a common sacrificial lead frame region 1330. Similarly, all the outer leads 102 are joined together at the common sacrificial lead frame region 1130 and the inner leads 108 extend either side of the inner frame 116. As above, the non-electrically conductive die mount 1202 can be molded to the lead frame 1300 and the inner fame 116 can be removed. Also, the inner leads 108 can be separated and spaced from the outer leads 102 by the removal of the common sacrificial lead frame region 1330 and thereafter further processing will result in the semiconductor die package 700 or 1000 being formed.

Figure 14:
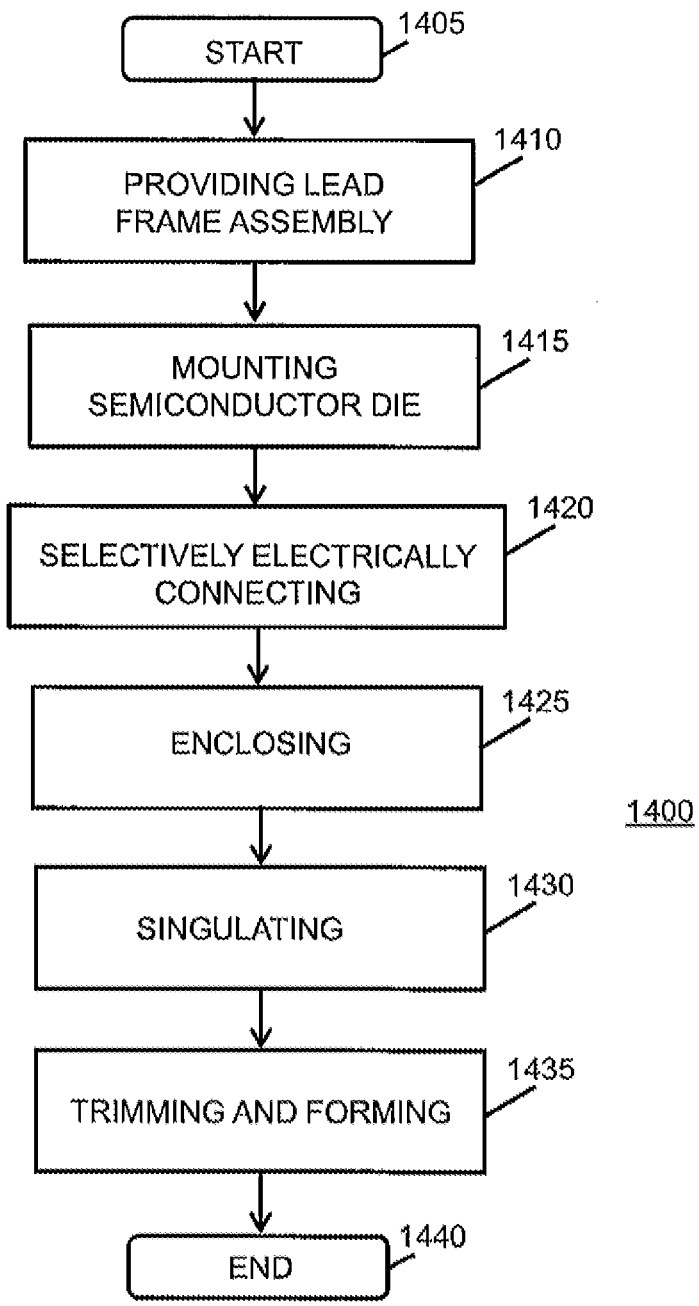
FIG. 14 is a flow chart illustrating a method for assembling a semiconductor die package in accordance with a fifth preferred embodiment of the present invention.

Referring to FIG. 14, a flow chart illustrating a method 1400 for manufacturing a semiconductor die package in accordance with a fifth preferred embodiment of the present invention is shown. By way of illustration only, the method 1400 will be described, where necessary, with reference to FIGS. 1 to 9. The method 1400 is initiated at a start block 1405 and thereafter, at a providing block 1410, the further modified lead frame assembly 400 is provided. This providing of the further modified lead frame assembly 400 includes a prior process of removing a common sacrificial lead frame region (sacrificial lengths of the outer leads 102) to thereby separate and space the inner leads 108 from the outer leads 102. In addition, this providing also includes a prior process of molding the non-electrically conductive die mount 202 to the upper surface areas of each inner lead external connection section 110 as well as the inner strut sections 120 and the flag 118.

Next, at a mounting block 1415, the semiconductor die 502 is mounted on the non-electrically conductive die mount 202, and at a block 1420 the method 1400 performs a process of selectively electrically connecting the bonding pads 504 of the semiconductor die 502 to the inner or outer lead bonding sections 106, 112. This selectively electrically connecting is performed by wire bonding with the bond wires 602. There is then performed, at an enclosing block 1425, a molding process that provides for enclosing the semiconductor die 502, bond wires 602, and each outer and inner lead bonding section 106, 112 with the mold compound 702 to thereby provide the semiconductor die package 700.

The method 1400 further includes, at a singulating block 1430, a process of removing the peripheral enclosing frame 114 of the lead frame assembly 400. Also, at a trimming and forming block 1435, the method trim and forms the outer leads 102 thereby configuring each outer lead external connection section 104 with the angled section 901. The method 1400 the terminates at an end block 1440 thereby providing, for example, the semiconductor die package 700 or 900 as will be apparent to a person skilled in the art.

Advantageously, the present invention provides a semiconductor die package with lead fingers or outer leads extending outside peripheral edges of the housing and lead fingers or inner leads allowing for surface mounting whilst maintaining a relatively small footprint.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A semiconductor die package, comprising:
    a plurality of outer leads each having an outer lead external connection section and an outer lead bonding section;
    a plurality of inner leads spaced from the outer leads, each of the inner leads having an inner lead external connection section spaced and downset from an inner lead bonding section;

a non-electrically conductive die mount molded onto upper surface areas of each inner lead external connection section and spaced from the plurality of outer leads;

a semiconductor die mounted on the non-electrically conductive die mount;

bond wires selectively electrically connecting bonding pads of the die to at least one inner lead bonding section and at least one outer lead bonding section; and a mold compound covering at least part of the semiconductor die, the bond wire, and the outer and inner lead bonding sections.

2. The semiconductor die package of claim 1, wherein the outer lead external connection section is downset from the outer lead bonding section.

3. The semiconductor die package of claim 2, wherein the inner lead external connection section has a planar inner lead external mounting surface and the outer lead external connection section has a planar outer lead external mounting surface that is co-planar with the planar inner lead external mounting surface.

4. The semiconductor die package of claim 3, wherein each of the outer leads has an angled section that forms each outer lead downset, the angled section being between the outer lead external connection section and the outer lead bonding section, and wherein the angled section is external to the mold compound.

5. The semiconductor die package of claim 3, wherein each of the outer leads has an angled section that forms each outer lead downset, the angled section being between the outer lead external connection section and the outer lead bonding section, and wherein the angled section is covered by the mold compound.

6. The semiconductor die package of claim 3, wherein both the mold compound and the non-electrically conductive die mount form an underside of the package.

7. The semiconductor die package of claim 6, wherein the planar inner lead external mounting surface protrudes from the underside of the package.

8. The semiconductor die package of claim 6, wherein the planar inner lead external mounting surface is coplanar with the underside of the package.

9. The semiconductor die package of claim 1, wherein the outer lead bonding section and inner lead bonding section have coplanar surfaces.

10. The semiconductor die package of claim 1, wherein the non-electrically conductive die mounts have a continuous surface for supporting the semiconductor die thereon.

11. A semiconductor die package, comprising:

a plurality of outer leads each having an outer lead external connection section and an outer lead bonding section;

a plurality of inner leads spaced from the outer leads, each of the inner leads having an inner lead external connection section spaced and downset from an inner lead bonding section;

a non-electrically conductive die mount molded onto upper surface areas of each inner lead external connection section and spaced from the plurality of outer leads;

a semiconductor die mounted on the non-electrically conductive die mount;

bond wires selectively electrically connecting bonding pads of the die to at least one inner lead bonding section and at least one outer lead bonding section; and a mold compound covering at least part of the semiconductor die, the bond wire, and the outer and inner lead bonding sections, wherein both the mold compound and the non-electrically conductive die mount form an underside of the package, wherein the inner lead external connection section has a planar inner lead external mounting surface that is co-planar with a planar outer lead external mounting surface of the outer lead external connection section.

* * * * *